(12) United States Patent
Tada

(10) Patent No.: US 9,530,496 B2
(45) Date of Patent: Dec. 27, 2016

(54) METHOD FOR PROGRAMMING SWITCHING ELEMENT

(71) Applicant: NEC CORPORATION, Tokyo (JP)

(72) Inventor: Munehiro Tada, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/895,239

(22) PCT Filed: Jun. 17, 2014

(86) PCT No.: PCT/JP2014/003246
§ 371 (c)(1),
(2) Date: Dec. 2, 2015

(87) PCT Pub. No.: WO2014/208049
PCT Pub. Date: Dec. 31, 2014

(65) Prior Publication Data
US 2016/0111153 A1 Apr. 21, 2016

(30) Foreign Application Priority Data

Jun. 24, 2013 (JP) ................................. 2013-131263

(51) Int. Cl.
*G11C 11/00* (2006.01)
*G11C 13/00* (2006.01)
(52) U.S. Cl.
CPC ....... *G11C 13/0069* (2013.01); *G11C 13/0011* (2013.01); *G11C 13/0016* (2013.01);
(Continued)

(58) Field of Classification Search
CPC . G11C 13/0069; G11C 16/10; G11C 13/0004; G11C 13/0007; G11C 11/5628; G11C 13/0064; G11C 13/0002; G11C 13/0011; G11C 11/1675; G11C 13/003; G11C 11/1659; G11C 11/2275; G11C 16/12; G11C 2013/0076; G11C 2211/5621; G11C 11/1677; G11C 2013/009; G11C 11/2259; G11C 2013/0092

See application file for complete search history.

(56) References Cited

U.S. PATENT DOCUMENTS

2010/0293350 A1* 11/2010 Happ ............... G11C 11/16 711/162
2011/0205782 A1* 8/2011 Costa ............... G11C 5/02 365/148

(Continued)

FOREIGN PATENT DOCUMENTS

JP 2010-153591 A 7/2010
JP 2012-64286 A 3/2012

(Continued)

OTHER PUBLICATIONS

Munehito Tada et al., "Polymer Solid-Electrolyte Switch Embedded on CMOS for Nonvolatile Crossbar Switch", IEEE Transactions on Electron Devices, Dec. 2011, pp. 4398-4405, vol. 58, No. 12.

(Continued)

*Primary Examiner* — Son Dinh
*Assistant Examiner* — Uyen B Tran
(74) *Attorney, Agent, or Firm* — Sughrue Mion, PLLC

(57) ABSTRACT

In order to realize a switching element that is highly reliable and can be highly integrated, in a method for programming a switching element of the present invention, programming of the switching element is performed by increasing or decreasing a resistance value R of a resistive-change film by applying a first pulse voltage to a first electrode or a second electrode, a measurement of the resistance value R is performed, verification in which it is determined whether or not the measured resistance value R is equal to a desired value is performed, and reprogramming of the switching element is performed by applying a second pulse voltage whose (Continued)

polarity is the same as that of the first pulse voltage to the same electrode to which the first pulse voltage is applied on the basis of the resistance value R when the resistance value R is not equal to the desired value.

9 Claims, 10 Drawing Sheets

(52) U.S. Cl.
CPC .. *G11C 13/0064* (2013.01); *G11C 2013/0076* (2013.01); *G11C 2013/0092* (2013.01); *G11C 2213/79* (2013.01)

(56) References Cited

U.S. PATENT DOCUMENTS

| | | | |
|---|---|---|---|
| 2012/0075911 A1* | 3/2012 | Nakura | G11C 13/0007 365/148 |
| 2013/0088911 A1 | 4/2013 | Nakura et al. | |

FOREIGN PATENT DOCUMENTS

| | | |
|---|---|---|
| JP | 2013-84324 A | 5/2013 |
| JP | 2013-520761 A | 6/2013 |
| WO | 2012/128017 A1 | 9/2012 |

OTHER PUBLICATIONS

International Search Report of PCT/JP2014/003246 dated Aug. 12, 2014.

\* cited by examiner

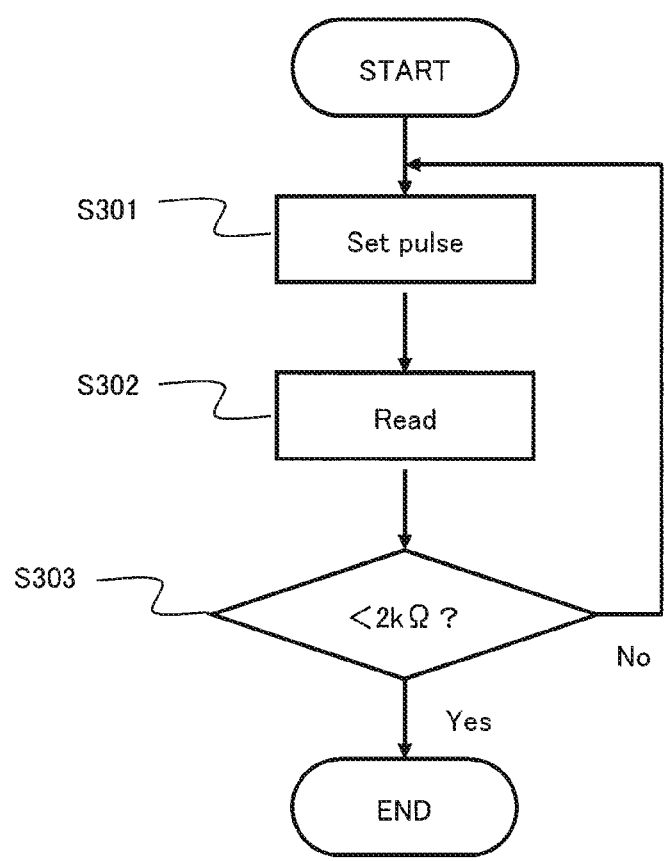

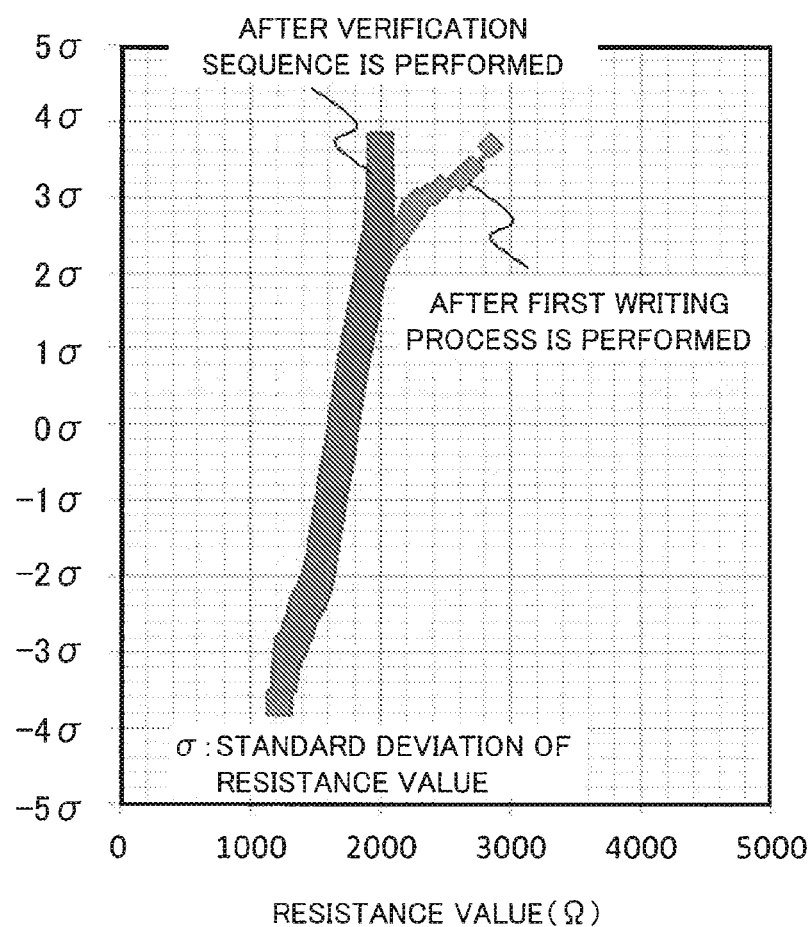

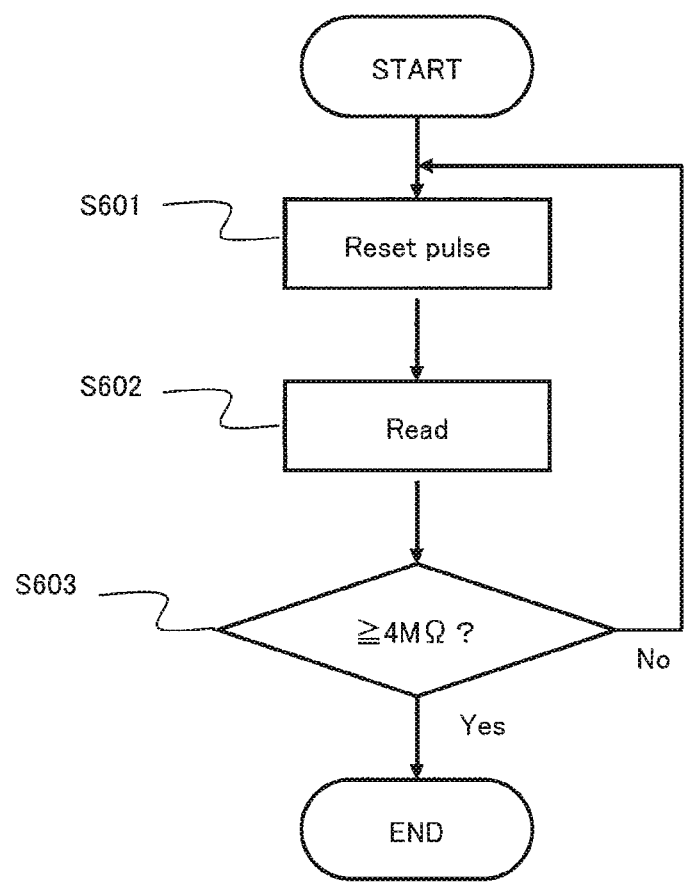

METHOD FOR PROGRAMMING SWITCHING ELEMENT

CROSS REFERENCE TO RELATED APPLICATIONS

This application is a National Stage of International Application No. PCT/JP2014/003246 filed Jun. 17, 2014, claiming priority based on Japanese Patent Application No. 2013-131263, filed Jun. 4, 2013, the contents of all of which are incorporated herein by reference in their entirety.

TECHNICAL FIELD

The present invention relates to a method for programming a switching element including a nonvolatile resistive-change element inside a multilayer wiring layer.

BACKGROUND ART

With respect to a semiconductor device, especially a silicon device, integration and reduction in power consumption have been achieved and miniaturization follows Moore's law in which an integration degree increases four times every three years. However, in recent years, the gate length of a MOSFET (Metal Oxide Semiconductor Field Effect Transistor) is reduced to 20 nm or less and the cost of a lithography process is greatly increased. Namely, the price of a lithography apparatus and the price of a mask set are remarkably increased. Further, it becomes difficult to achieve integration and miniaturization of the semiconductor device according to the scaling rule that follows Moore's law because of the physical limitation of the size of the device, in other words, because of the limitation of operation or the limitation of variation. Accordingly, it is necessary to improve the performance of the device by another approach different from the scaling rule.

In recent years, a reconfigurable programmable logic device called an FPGA (Field-Programmable Gate Array) that is classified between a gate array and a standard cell has been developing. The FPGA can be arbitrarily programmed by a customer himself after a chip is manufactured. Namely, the FPGA includes resistive-change elements inside the multilayer wiring layer and the customer himself can arbitrarily connect the wiring electrically. By using the semiconductor device mounting such FPGA, the flexibility of the circuit can be improved.

The resistive-change element is used for a MRAM (Magnetoresistive Random Access Memory), a PRAM (Phase-change Random Access Memory), a ReRAM (Resistance Random Access Memory), a CBRAM (Conductive Bridge Random Access Memory), or the like.

The resistive-change element used for the ReRAM among these memories includes two electrodes and a resistive-change film made of metal oxide sandwiched between these electrodes and a property in which a resistance value changes when an electric field is applied between two electrodes is used. Namely, by applying the electric field between two electrodes, a filament is formed inside the resistive-change film and whereby, a conductive path is formed between two electrodes and the resistance between two electrodes is reduced. This state is defined as an ON state. On the other hand, by applying the electric field whose polarity is opposite to that of the above-mentioned electric field between two electrodes, the filament disappears and whereby, the conductive path formed between two electrodes disappears and the resistance is increased. This state is defined as an OFF state. By changing the polarity of the applied electric field, the value of the resistance between two electrodes greatly changes. Namely, the state can be changed from the ON state to the OFF state or vice versa and the switching can be performed.

Because the resistance value in the ON state is different from the resistance value in the OFF state, an electric current flowing in the resistive-change element changes according to the state of the resistive-change element. Accordingly, the ReRAM stores data by using this characteristic. When the data is written in the ReRAM, a voltage value, a current value, and a pulse width that are required for changing the state from the ON state to the OFF state or vice versa are selected and applied according to the data to be stored. By this operation, the filament is formed or lost, in other words, the conductive path is formed or lost.

A kind of resistive-change element used for the ReRAM uses metal ion movement in an ion conductor, metal deposition caused by reduction of a metal ion in an electrochemical reaction, and metal ion formation caused by oxidation of metal. In non-patent literature 1, there is disclosed a nonvolatile switching element in which the value of the resistance between the electrodes between which the resistive-change film is sandwiched is reversibly changed. A RAM using this nonvolatile switching element is called a CBRAM.

The nonvolatile switching element disclosed in non-patent literature 1 is composed of a solid electrolyte consisting of the ion conductor and a first electrode and a second electrode that are provided so that the electrodes contact with each of two surfaces of the solid electrolyte. A standard formation Gibbs energy $\Delta G$ in a process in which a metal ion is formed by the oxidation of a first metal of which the first electrode is composed is different from a standard formation Gibbs energy $\Delta G$ in a process in which a metal ion is formed by the oxidation of a second metal of which the second electrode is composed. The first metal of which the first electrode is composed and the second metal of which the second electrode is composed that are described in non-patent literature 1 are selected as follows.

First, when a voltage for changing the state from the OFF state to the ON state is applied between the first electrode and the second electrode, the first metal of which the first electrode is composed is oxidized by electrochemical reaction induced by the applied voltage and the metal ion is formed at a boundary face between the first electrode and the solid electrolyte. At this time, the metal that can be supplied in the solid electrolyte as the metal ion is selected as the first electrode.

On the other hand, when a voltage for changing the state from the ON state to the OFF state is applied between the first electrode and the second electrode, the first metal is oxidized by electrochemical reaction induced by the applied voltage and the metal ion is formed when the first metal is deposited on the surface of the second electrode. At this time, the first metal is melted in the solid electrolyte as the metal ion. On the other hand, a metal which is not oxidized by the applied voltage and does not form the metal ion is selected as the second metal of which the second electrode is composed.

Switching operation of a metal-bridge-type resistive-change element in which the ON state and the OFF state of the resistive-change element are formed by formation of a metal-bridge-type structure in which the first electrode and the second electrode are bridged by depositing the first metal of which the first electrode is composed on the second electrode and melting of the metal-bridge-type structure will be described.

In a transition process (referred to as a set process) in which the state is changed from the OFF state to the ON state, when the second electrode is grounded and a positive voltage is applied to the first electrode, the metal of the first electrode is oxidized, the metal ion is formed at the boundary face between the first electrode and the solid electrolyte, and the metal melts in the solid electrolyte. On the other hand, in a second electrode side, the metal ion in the solid electrolyte is reduced to the metal and the metal is deposited by an electron supplied from the second electrode. The metal-bridge-type structure is formed in the solid electrolyte by the deposited metal and whereby, the first electrode is electrically connected to the second electrode and the state of the switch is changed to the ON state.

On the other hand, in a transition process (referred to as a reset process) in which the state is changed from the ON state to the OFF state, when the second electrode is grounded and a negative voltage is applied to the first electrode, the metal of which the metal bridge is composed is ionized and the metal is eluted in the solid electrolyte. When the elution proceeds, a part of the metal-bridge is disconnected, the first electrode is electrically disconnected from the second electrode, and the state of the switch is changed to the OFF state.

Further, when the metal bridge is being melted, the bridge becomes thin and whereby, the resistance between the electrodes increases. Further, when the concentration of the metal ion included in the solid electrolyte changes, the relative permittivity of the solid electrolyte changes and whereby, the capacitance between the electrodes changes. After these changes occur, finally, the electrical connection is disconnected.

Further, with respect to the metal-bridge-type resistive-change element whose state is changed to the OFF state, when the second electrode is grounded and a positive voltage is applied to the first electrode again, the transition process (the set process) in which the state is changed from the OFF state to the ON state proceeds. Namely, in the metal-bridge-type resistive-change element, the transition process (the set process) in which the state is changed from the OFF state to the ON state and the transition process (the reset process) in which the state is changed from the ON state to the OFF state can be performed reversibly.

CITATION LIST

Patent Literature

[PTL 1] Japanese Patent Application Laid-Open No. 2010-153591

Non Patent Literature

[NPL 1] M. Tada, K. Okamoto, T. Sakamoto, M. Miyamura, N. Banno, and H. Hada, "Polymer Solid-Electrolyte (PSE) Switch Embedded on CMOS for Nonvolatile Crossbar Switch", IEEE TRANSACTION ON ELECTRON DEVICES, Vol. 58, No. 12, pp. 4398-4405, (2011).

SUMMARY OF INVENTION

Technical Problem

When programming the switching element in which the above-mentioned metal-bridge-type resistive-change element is formed in the semiconductor device, the resistance state of the element is changed from the low-resistance state to the high-resistance state or from the high-resistance state to the low-resistance state by applying a pulse voltage to the electrode of each element. In this case, when a semiconductor device in which a large number of switching elements are integrated is programmed at one time, a case in which some switching elements fail to be programmed may occurs. In order to detect the element that fails to be programmed, verification is performed to verify whether or not the element is in a desired resistance state after applying the pulse voltage.

With respect to the element detected by the verification, it is considered effective to perform reprogramming of the element that fails to be programmed. However, in a method for programming the switching element using the metal-bridge-type resistance change, a problem in which there is no suitable method for performing verification and reprogramming based on the verification occurs.

The present invention is made in view of the above-mentioned problem. An object of the present invention is to provide a method for performing verification and reprogramming based on the verification used when programming the switching element using the metal-bridge-type resistance change and realize a switching element that is highly reliable and can be highly integrated.

Solution to Problem

A method for programming a switching element of the present invention is a method for programming a switching element including a first electrode, a second electrode, and a resistive-change film which is provided between the first electrode and the second electrode and whose resistance value R changes according to an electric potential difference between the first electrode and the second electrode. In the method for programming a switching element of the present invention, programming of the switching element is performed by increasing or decreasing the resistance value R of the resistive-change film by applying a first pulse voltage to the first electrode or the second electrode, a measurement of the resistance value R is performed, verification in which it is determined whether or not the measured resistance value R is equal to a desired value is performed, and reprogramming of the switching element is performed by applying a second pulse voltage whose polarity is the same as that of the first pulse voltage to the same electrode to which the first pulse voltage is applied on the basis of the resistance value R when the resistance value R is not equal to the desired value.

Advantageous Effects of Invention

By using the present invention, a method for performing verification and reprogramming based on the verification used when programming a switching element using the metal-bridge-type resistance change is provided and a switching element that is highly reliable and can be highly integrated can be realized.

BRIEF DESCRIPTION OF DRAWINGS

FIG. 3A is a figure showing a sequence including verification used when programming (writing) a switching element according to a second exemplary embodiment of the present invention.

FIG. 3B is a figure showing a distribution of a resistance value of a switching element according to a second exemplary embodiment of the present invention before and after a sequence.

FIG. 6A is a figure showing a sequence including verification used when programming (erasing) a switching element according to a third exemplary embodiment of the present invention.

DESCRIPTION OF EMBODIMENTS

Figure 1:
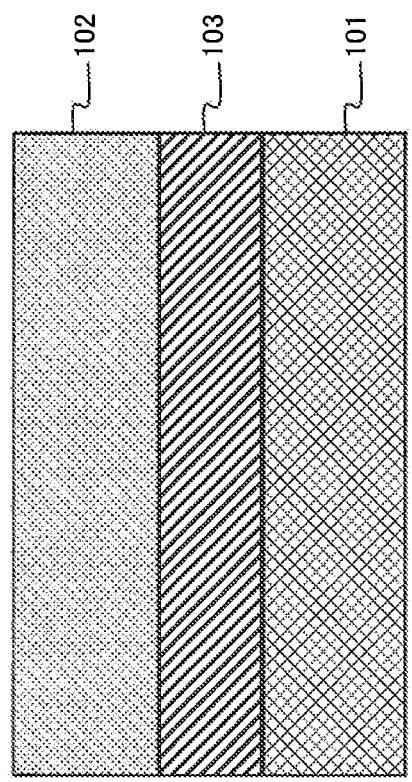
FIG. 1 is a figure showing a structure of a switching element according to a first exemplary embodiment of the present invention.

An exemplary embodiment of the present invention will be described below in detail with reference to the drawing. Although in the exemplary embodiment described below, various preferable technical limitations to carry out the present invention are imposed, a scope of the invention is not limited to the embodiment or illustrated examples.

(First Exemplary Embodiment)

FIG. 1 shows is a structure of a switching element to be programmed according to a first exemplary embodiment of the present invention. The switching element according to the exemplary embodiment includes a first electrode 101, a second electrode 102, and a resistive-change film 103 which is provided between the first electrode 101 and the second electrode 102 and whose resistance value R changes according to an electric potential difference between the first electrode 101 and the second electrode 102. In the method for programming the switching element, programming of the switching element is performed by increasing or decreasing the resistance value R of the resistive-change film 103 by applying a first pulse voltage to the first electrode 101 or the second electrode 102. Further, a measurement of the resistance value R is performed and verification in which it is determined whether or not the measured resistance value R is equal to the desired value is performed. Further, reprogramming of the switching element is performed by applying a second pulse voltage whose polarity is the same as that of the first pulse voltage to the same electrode to which the first pulse voltage is applied on the basis of the resistance value R when the resistance value R is not equal to the desired value.

By using this exemplary embodiment, a method for performing verification and reprogramming based on the verification used when programming a switching element using the metal-bridge-type resistance change is provided and a switching element that is highly reliable and can be highly integrated can be realized.

(Second Exemplary Embodiment)

A second exemplary embodiment of the present invention that is more specific than the first exemplary embodiment will be described by using FIG. 1. The switching element according to this exemplary embodiment includes the metal-bridge-type resistive-change film 103, the first electrode 101, and the second electrode 102. The first electrode 101 is an active electrode and contains, for example copper. Further, the second electrode 102 is an inert electrode and contains, for example ruthenium.

The resistive-change film 103 is made of a solid electrolyte material such as oxide, sulfide, organic matter, or the like. Further, an oxidation-deficient resistive-change element may be used. For example, oxide containing Al, Ti, Ta, Si, Hf, Zr, or the like, chalcogenide compound containing Ge, As, TeS, or the like, an organic polymeric film containing carbon, oxygen, and silicon, or the like can be used. Further, a laminated structure of these materials may be used.

The first electrode 101 is mainly composed of copper and it may contain Ti, Al, Mn, W, Mg, or the like as an additive. The second electrode 102 is mainly composed of Ru or Pt and it may contain Ta, Ti, W, or the like.

The switching element according to this exemplary embodiment includes a solid electrolyte layer that is the resistive-change film 103 and the first electrode 101 and the second electrode 102 that are disposed so as to face to each other so that the solid electrolyte layer contacts with the surfaces of the first electrode 101 and the second electrode 102 that are opposite to a negative side. The first electrode 101 has a role in supplying a metal ion to the solid electrolyte layer. The metal ion is not supplied from the second electrode 102. The first electrode 101 is called the active electrode and the second electrode 102 is called the inert electrode.

Operation of this switching element will be described below.

When the first electrode 101 is grounded and a negative voltage is applied to the second electrode 102, the metal of the first electrode is ionized and the metal is eluted in the solid electrolyte. The metal ion in the solid electrolyte layer is reduced to the metal and the metal is deposited in the solid electrolyte layer. By the metal deposited in the solid electrolyte layer, the metal bridge connecting the first electrode 101 and the second electrode 102 is formed. When the first electrode 101 is electrically connected to the second electrode 102 by the metal bridge, a state of the switching element is changed to the ON state.

The state of the switching element can be changed to the ON state even when the second electrode 102 is grounded and a positive voltage is applied to the first electrode 101. This is because the electric potential difference between the first electrode and the second electrode when the first electrode 101 is grounded and the negative voltage is applied to the second electrode 102 is equal to the electric potential difference between the first electrode and the second electrode when the second electrode 102 is grounded and the positive voltage is applied to the first electrode 101.

On the other hand, when the switching element is in the ON state, if the first electrode 101 is grounded and the positive voltage is applied to the second electrode 102, a part of the metal bridge is disconnected. As a result, the electrical connection between the first electrode 101 and the second electrode 102 is cut off and the state of the switching element is changed to the OFF state. Further, before the electrical connection between the first electrode 101 and the second electrode 102 is completely cut off, the electrical characteristics change, for example the resistance between the first electrode 101 and the second electrode 102 increases and the capacity between the first and second electrodes changes. Finally, the electrical connection is cut off.

The state of the switching element can be changed to the OFF state even when the second electrode 102 is grounded and a negative voltage is applied to the first electrode 101. This is because the electric potential difference between the first electrode and the second electrode when the first electrode 101 is grounded and the positive voltage is applied to the second electrode 102 is equal to the electric potential difference between the first electrode and the second electrode when the second electrode 102 is grounded and the negative voltage is applied to the first electrode 101.

Further, when the state is changed from the OFF state to the ON state, the first electrode 101 is grounded and the negative voltage is applied to the second electrode 102 or the second electrode 102 is grounded and the positive voltage is applied to the first electrode 101 again.

Figure 2:
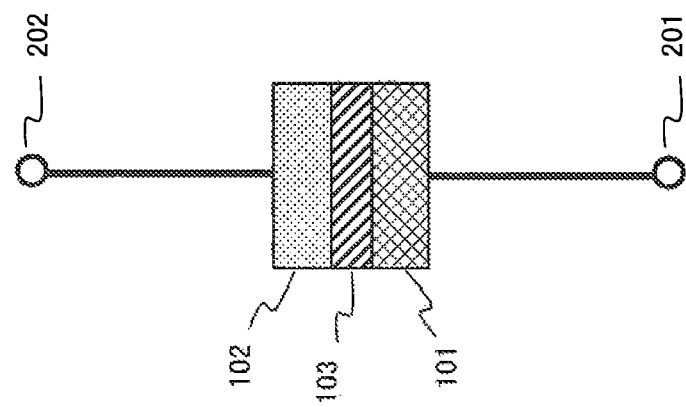
FIG. 2 is a figure showing a structure of a switching element according to a second exemplary embodiment of the present invention.

FIG. 2 shows a structure of the switching element according to the exemplary embodiment. The switching element according to the exemplary embodiment includes the metal-bridge-type resistive-change film 103, the first electrode 101, the second electrode 102, a first terminal 201 connected to the first electrode 101, and a second terminal 202 connected to the second electrode. When programming (writing) the switching element in order to change the state thereof from the high-resistance state to the low-resistance state, the second electrode 102 is grounded and the positive voltage is applied to the first electrode 101. On the other hand, when programming (erasing) the switching element in order to change the state from the low-resistance state to the high-resistance state, the first electrode 101 is grounded and the positive voltage is applied to the second electrode 102.

A result of a study performed by the inventors shows that the resistance value of the switching element is represented as a function of a width t of a voltage pulse and a programming current I. This means that an amount (conductive substance amount) J of supply of electrolytically-generated copper in the solid electrolyte can be explained by using a model similar to Faraday's first law.

$$J=K*I*t=K*Q \quad \text{Equation (1)}$$

Where, J is an amount of supply (conductive substance amount), K is a constant, I is a programming current, t is a width of a voltage pulse, and Q is an amount of charge. There is a correlation between the amount J of supply of copper (conductive substance amount) and a resistance value $R_{ON}$ of the switching element in ON state.

$$1/J \propto R_{ON} \quad \text{Equation (2)}$$

However, an electrolytic ion is not included in the solid electrolyte but electron conduction occurs via the solid electrolyte that is a thin film insulator (about 5 nm thickness). Therefore, movement of all the electric charges does not occur by the transportation of copper ion unlike usual electrolysis. When sensitivity indexes m and n are introduced in the electric current I and the pulse width t, respectively, an experimental value can be well explained when t<1 msec.

$$R_{ON}=A*I^m*t^n \quad \text{Equation (3)}$$

$$R_{ON}=\exp(-3.4)*I^{-1.3}*t^{-0.05} \propto J^{-1} \quad \text{Equation (4)}$$

J is the conductive substance amount supplied in the solid electrolyte. In this exemplary embodiment, this is mainly copper and the resistance value is low when J is large. The values of m and n depend on a process and a material and can be obtained by performing a test in advance under various conditions in which various programming currents and various voltage pulse widths are used. In order to obtain a desired resistance value, it is possible to set the values of I and t on the basis of equation (4) and program the switching element.

For example, the value of A, the value of m, and the value of n in Equation (4) shown in this exemplary embodiment are obtained under the condition in which a composite oxide of TiAl is formed by 1 nm on a copper electrode including Al and Ti as an additive, a low density organic polymer film including 30 percent of SiO is formed by 4 nm on the composite oxide, and a RuTa alloy is used an inert electrode.

When programming (writing) the switching element in order to change the state of the switching element from the high-resistance state to the low-resistance state, a write defect in which a resistance value in the ON state is set to a value greater than the desired value may occur. The inventor shows that this defect is generated by the existence of the element which accidentally has a high resistance value because of the variation of the value of A of the element. Namely, the inventor shows that when the value of A is large, the amount J of supply of copper is small and whereby, the resistance value in the ON state is large. In order to solve this problem, the copper ion corresponding to the shortfall has to be supplied to the solid electrolyte by reprogramming the switching element. Therefore, for example, even when programming the switching element by using the same condition, in other words, by using the same current value, the high-resistance defect can be solved by additionally applying the pulse voltage.

Alternatively, a sequence which automatically calculates the amount of copper corresponding to the shortfall according to Equation (3) in order to obtain the desired resistance value is set, a Set pulse of which the current is not changed and only a time for applying the pulse voltage is changed is applied, and whereby, the reprogramming based on the verification can be performed.

For example, when the desired value of the resistance $R_{ON}$ is 2 kΩ and the resistance value of a defect bit is 4 kΩ, it is known according to Equation (3) that two times amount of copper has to be supplied. Therefore, the copper corresponding to the shortfall is supplied to the solid electrolyte by supplying two times amount of copper by increasing a pulse voltage applying time and the desired resistance value can be obtained.

An algorithm in which the amount of the copper in the solid electrolyte set in advance is calculated and the copper corresponding to the shortfall is supplied on the basis of the read resistance value of the switching element will be described below. Namely, the values of m and n are calculated in advance according to Equation (3) and the voltage pulse width and the current value used for the reprogramming are set on the basis of the value of A of the written bit.

In this exemplary embodiment, a case in which the switching element is programmed (written) in order to change the state of the switching element from the high-resistance state to the low-resistance state is taken as an example. The resistance value in the low-resistance state is smaller than 10 kΩ and preferably equal to or smaller than 2 kΩ. A case in which the resistance value in the high-resistance state is determined to be equal to or greater than 10 kΩ and the voltage pulse is used for programming the switching element will be described.

FIG. 3A shows a sequence including verification used when programming (writing) the switching element in order to change the state of the switching element from the high-resistance state to the low-resistance state. First, as the Set pulse, a first voltage pulse is applied to the switching element in the high-resistance state (S301). In this case, for example, the amplitude and the width of the voltage pulse may be 3.3 V and 1 μs, respectively. Next, a Read operation to read the resistance value of the switching element is performed (S302). In reading the resistance value, the measurement can be performed by using a voltage whose polarity is the same as that of the voltage pulse used when programming the switching element. Next, the resistance value is determined (S303). When the resistance value of the switching element is smaller than 2 kΩ, the sequence ends.

On the other hand, when the resistance value of the switching element is equal to or greater than 2 kΩ, a second voltage pulse is applied on the basis of the resistance value (S301). The second voltage pulse is a pulse for reprogramming. Here, the amplitude and the width of the second voltage pulse may be set equal to those of the first voltage pulse. Further, the amplitude and the width of the second voltage pulse can be determined according to Equation (3). After this process, the resistance value is read again (S302) and when the resistance value of the switching element is smaller than 2 kΩ, the sequence ends. On the other hand, when the resistance value of the switching element is equal to or greater than 2 kΩ, the second voltage pulse is applied as the Set pulse once again (S301).

FIG. 3B shows the distribution of the resistance value of a switching element array before and after the sequence of this exemplary embodiment shown in FIG. 3A. Before the sequence including verification shown in FIG. 3A is not performed, in other words, after the first writing process is performed, the resistance value varies widely and there are a plurality of resistive-change elements whose resistance value is equal to or greater than 2 kΩ. In contrast, it is shown in FIG. 3B that after implementing the sequence shown in FIG. 3A, variation of the distribution of the resistance value is reduced and all the resistance values are smaller than 2 kΩ.

In this exemplary embodiment, the first Set pulse is applied and when the switching element fails to be programmed, in other words, the resistance value of the switching element is not sufficiently low (about from 2 kΩ to 3 kΩ in FIG. 3B), a pulse voltage that is equal to the first pulse voltage is applied to the switching element again and once again. By this process, the copper corresponding to the shortfall is supplied and whereby, the resistance value of the switching element can be reduced to the desired resistance value. FIG. 3A shows that the reprogramming based on the verification can be performed.

Another experimental result shows that the reprogramming based on the verification shown in FIG. 3A can be performed to the element to which writing is performed once. This experimental result will be described below.

Figure 4:
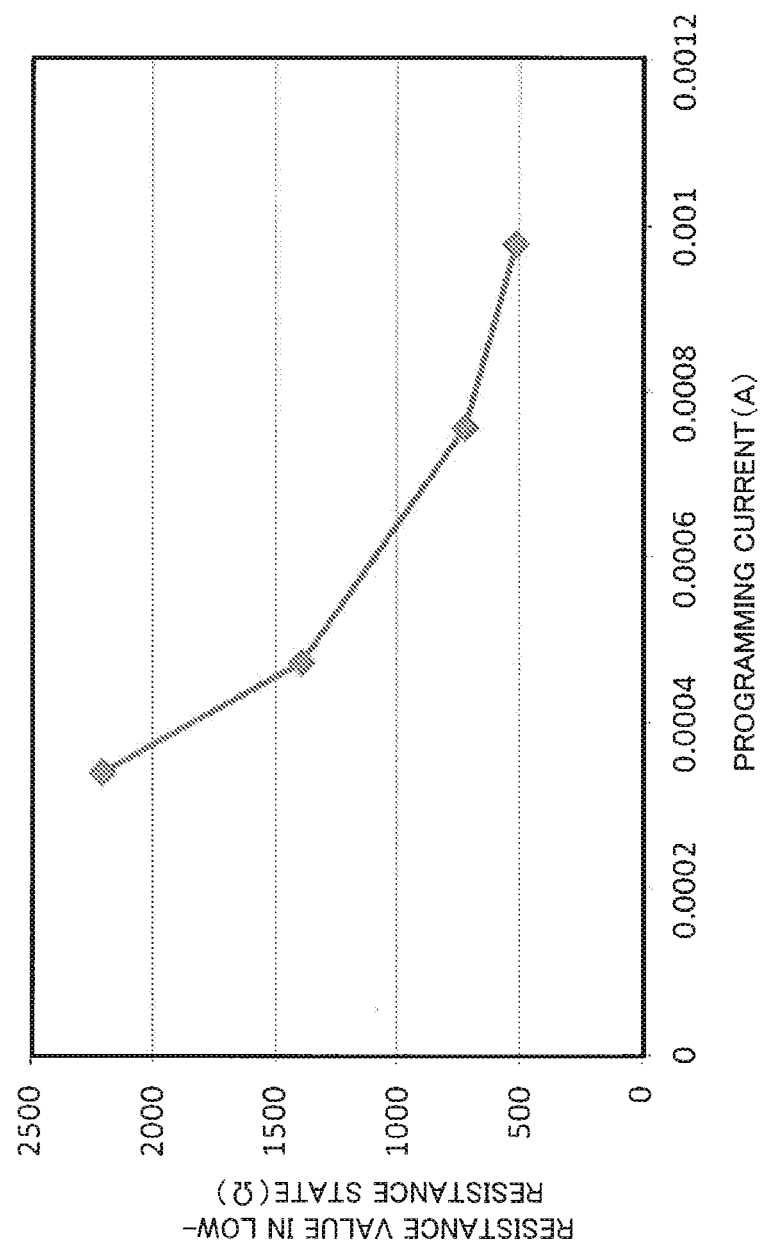
FIG. 4 is a figure showing a programming current-dependent characteristic of a resistance value of a switching element in low-resistance state according to a second exemplary embodiment of the present invention.

When the state of the switching element is changed from the high-resistance state to the low-resistance state, the resistance value in the low-resistance state can be controlled by the programming current according to Equation (3). For example, in FIG. 4, the first electrode 101 is mainly composed of copper. Further, the switching element 103 is made of the solid electrolyte material that is the organic polymeric film containing carbon, oxygen, and silicon. Further, the second electrode 102 is mainly composed of Ru and contains Ta or Ti. FIG. 4 is a graph of the resistance value in low-resistance state versus the programming current in the above-mentioned case. The pulse width of the programming current is set to a constant value of 100 μs. It is shown in FIG. 4 that when the programming current is reduced, the resistance value in the low-resistance state is increased.

Figure 5:
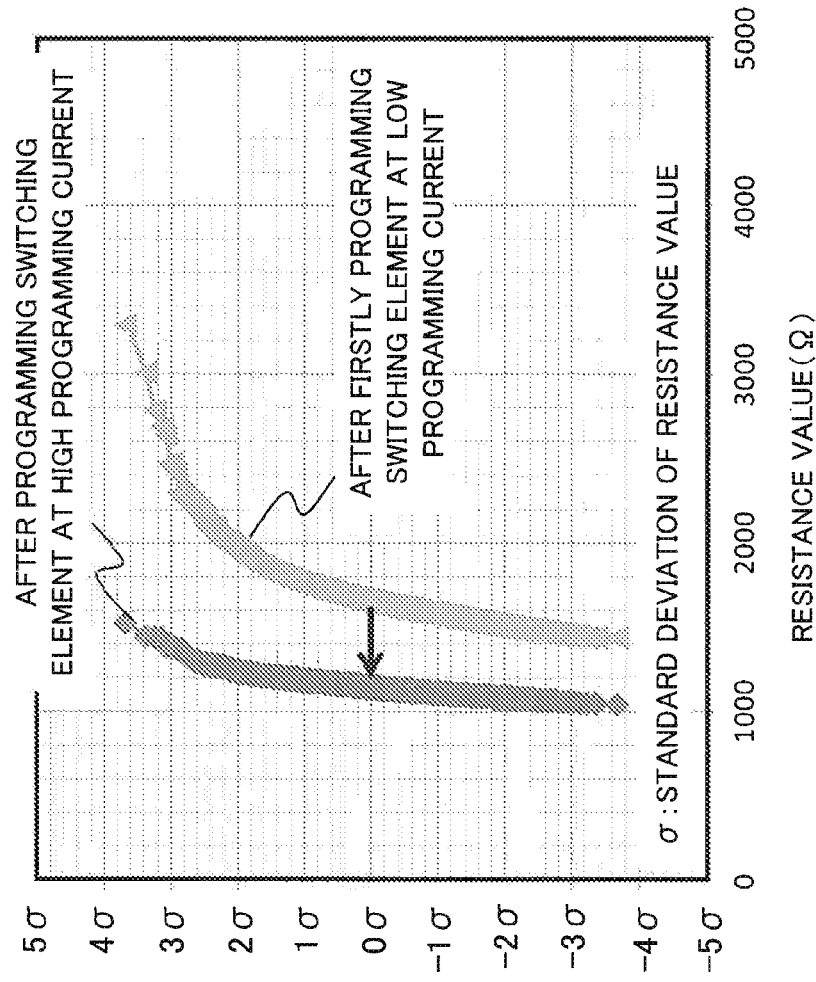
FIG. 5 is a figure showing a distribution of a resistance value of a switching element according to a second exemplary embodiment of the present invention after first programming the switching element at a low programming current and after programming the switching element at a high programming current.

The inventors performed an experiment in which a write defect occurring in the first writing process as shown in FIG. 3 in which a resistance value is set to a high resistance value is intentionally created by reducing the programming current and the element having the write defect is produced, verification and reprogramming based on the verification of this element are performed, and it is confirmed whether or not the resistance value can be reduced. FIG. 5 shows a result. In the first writing process, the programming current is set to 400 μA and the current flows for 1 μs. A result of this experiment shows that the resistance value is distributed around 1.5 kΩ. The programming current of 700 μA that is higher than the first programming current is applied to these elements in the low-resistance state for 1 μs. By applying the high programming current, the resistance values of all the elements are changed to the resistance value of about 1.2 kΩ and the element whose resistance value is equal to or greater than 2 kΩ does not exist. From this result, it is shown that the element can be normally programmed by performing the reprogramming process in which the conductive substance corresponding to the shortfall is supplied to the defective element whose resistance value is high.

By using the method for programming the switching element according to this exemplary embodiment, the method for performing suitable verification and reprogramming based on the verification used when programming the switching element using the metal-bridge-type resistance change is provided. As a result, the state of the switching element can be highly reliably changed from the ON state to the OFF state or vice versa. Further, the state of each switching element can be highly reliably changed and whereby, many switching elements can be used. Namely, the switching element can be highly integrated.

As described above, by using this exemplary embodiment, the method for performing verification and reprogramming based on the verification used when programming the switching element using the metal-bridge-type resistance change is provided and a switching element that is highly reliable and can be highly integrated can be realized.

(Third Exemplary Embodiment)

A third exemplary embodiment of the present invention that is more specific than the first exemplary embodiment will be described by using FIG. 1. The switching element according to this exemplary embodiment includes the metal-bridge-type resistive-change film 103, the first electrode 101, and the second electrode 102. The first electrode 101 is an active electrode and is composed of, for example copper. The second electrode 102 is the inert electrode and is composed of, for example, ruthenium. The material of which the switching element according to this exemplary embodiment is composed is the same as that of the switching element according to the second exemplary embodiment. Therefore, the detail description will be omitted.

FIG. 2 shows a structure of the switching element according to this exemplary embodiment similar to that of the switching element according to the second exemplary embodiment. The switching element according to this exemplary embodiment includes the metal-bridge-type resistive-change film 103, the first electrode 101, the second electrode 102, the first terminal 201 connected to the first electrode 101, and the second terminal 202 connected to the second electrode. When programming (erasing) the switching element in order to change the state from the low-resistance state to the high-resistance state, the first electrode 101 is grounded and a positive voltage is applied to the second electrode 102.

A result of experiment performed very well by the inventors shows that the residue of the conductive substance which is left in the solid electrolyte that is the resistive-change film has an influence on the variation of the resistance value of the switching element in the high-resistance state. This is because the copper deposited in the solid electrolyte when implementing the writing process is left without being completely collected when implementing the erasing process.

In this exemplary embodiment, the solid electrolyte does not include an electrolytic ion. However, the thickness of the solid electrolyte is set to 6 nm or less as a thin film. Therefore, a high electric potential difference is generated between the electrodes. The result shows that the collection of copper can be facilitated by using a long erasing time like the second exemplary embodiment.

In this exemplary embodiment, a case in which the switching element is programmed (erased) in order to change the state of the switching element from the low-resistance state to the high-resistance state is used. The resistance value in the low-resistance state is smaller than 10 kΩ and preferably equal to or smaller than 2 kΩ. A case in which the resistance value in the high-resistance state is determined to be equal to or greater than 10 kΩ and the voltage pulse is used for programming the switching element will be described.

FIG. 6A shows a sequence including verification used when programming (erasing) the switching element in order to change the state of the switching element from the low-resistance state to the high-resistance state. First, as a Reset pulse, the first voltage pulse is applied to the switching element in the low-resistance state (S601). For example, the amplitude and the width of the voltage pulse may be 2.5 V and 10 µs, respectively. Next, a Read operation to read the resistance value of the switching element is performed (S602) and the resistance value is determined (S603). When reading the resistance value, the measurement can be performed by using a voltage whose polarity is the same as that of the voltage pulse used when programming the switching element. When the resistance value of the element is equal to or greater than 4 MΩ, the sequence ends. Here, the resistance value of 4 MΩ is shown as an example in a case in which the resistance value in the high-resistance state is determined to be equal to or greater than 10 kΩ.

On the other hand, when the resistance value of the element is smaller than 4 MΩ, the process goes back to step S601 and a second voltage pulse is applied (S601). The second voltage pulse is a pulse for reprogramming based on the verification. Here, the amplitude and the width of the second voltage pulse may be the same as those of the first voltage pulse. Further, the amplitude and the width of the second voltage pulse can be determined according to Equation (3) like the second exemplary embodiment.

Next, the resistance value is read again (S602). When the resistance value of the switching element is equal to or greater than 4 MΩ, the sequence ends. On the other hand, when the resistance value of the switching element is smaller than 4 MΩ, the process goes back to step S601 once again.

Figure 6B:
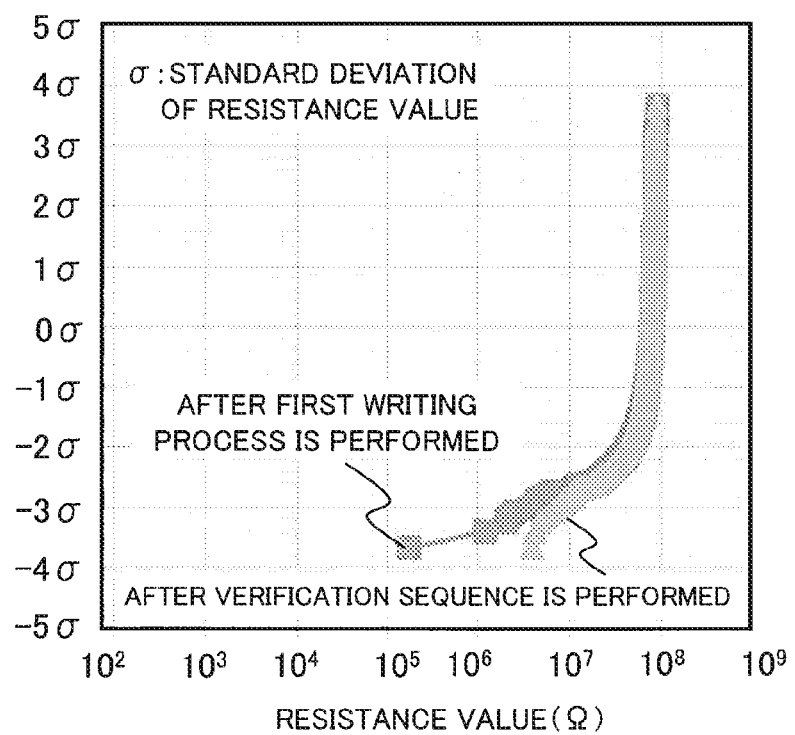
FIG. 6B is a figure showing a distribution of a resistance value of a switching element according to a third exemplary embodiment of the present invention before and after a sequence.

FIG. 6B is a figure showing a distribution of the resistance value of the switching element before and after the sequence of the exemplary embodiment. Before the sequence including verification shown in FIG. 6A is not performed, in other words, after the first writing process is performed, the resistance value varies widely and there are a plurality of resistive-change elements whose resistance value is smaller than 4 MΩ. In contrast, it is shown in FIG. 6B that variation of the distribution of the resistance value is reduced and the resistance values of all the elements are greater than 4 MΩ after the sequence shown in FIG. 6A is performed.

This result shows that verification and reprogramming based on the verification can be performed by applying the pulse voltage to the switching element that fails to be programmed by the first Reset pulse, in other words, the switching element whose resistance value is smaller than the desired resistance value again and once again.

Further, when the state of the switching element is changed to the high-resistance state, a current that flows when the voltage is applied is low. Accordingly, a verification program in which the pulse voltage is simultaneously applied to a large number of elements can be used.

By using the method for programming the switching element according to this exemplary embodiment, the method for performing suitable verification and reprogramming based on the verification used when programming the switching element using the metal-bridge-type resistance change is provided. As a result, the state of the switching element can be highly reliably changed from the ON state to the OFF state or vice versa. Further, the state of each switching element can be highly reliably changed and whereby, many switching elements can be used. Namely, the switching element can be highly integrated.

As described above, by using this exemplary embodiment, the method for performing verification and reprogramming based on the verification used when programming the switching element using the metal-bridge-type resistance change is provided and a switching element that is highly reliable and can be highly integrated can be realized.

(Fourth Exemplary Embodiment)

As a fourth exemplary embodiment of the present invention, a semiconductor device shown in FIG. 7 in which a MOSFET is formed on a semiconductor substrate and a switching element is formed inside a copper wiring will be described.

Figure 7:
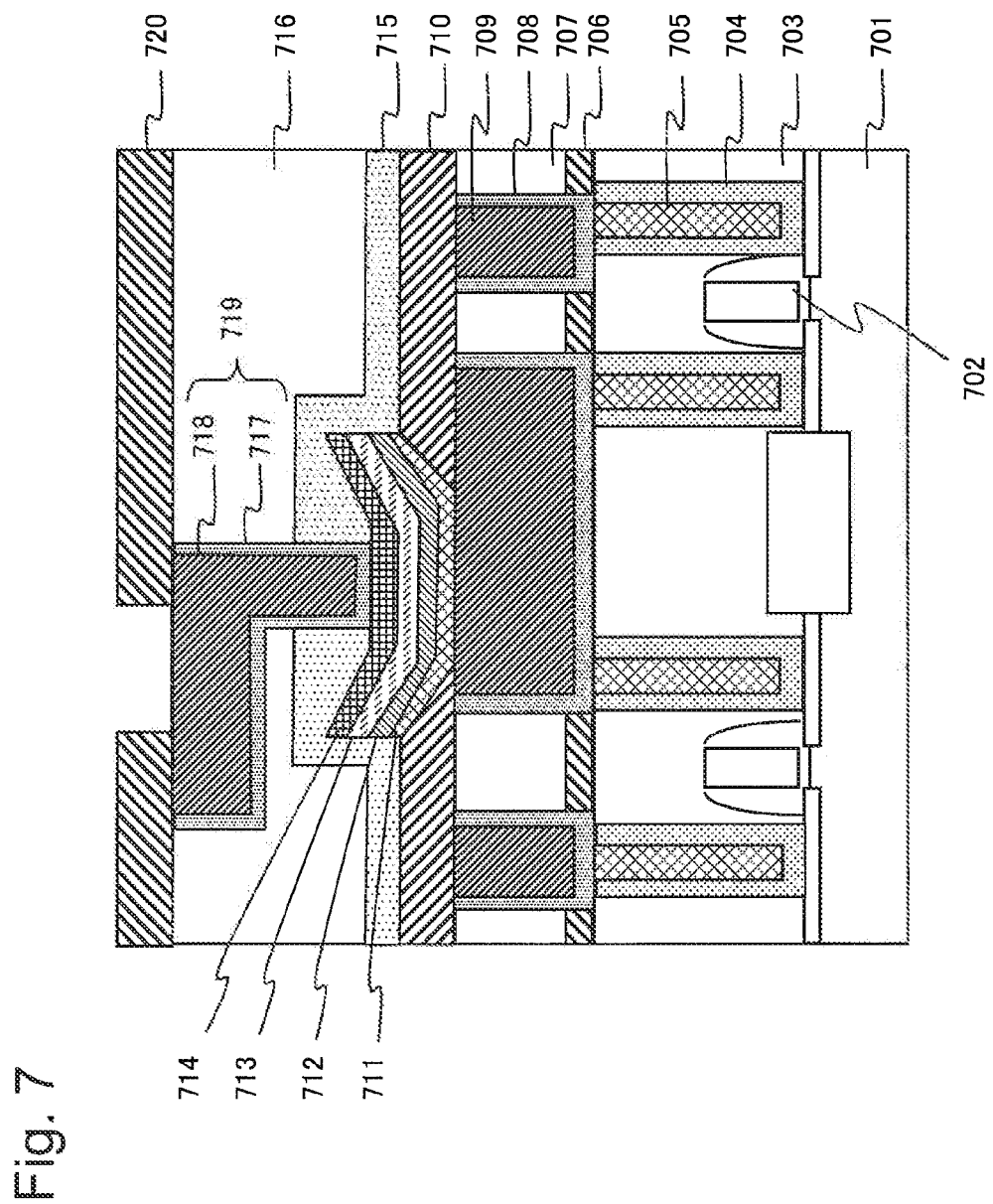
FIG. 7 is a sectional view showing a structure of a semiconductor device including a switching element according to a fourth exemplary embodiment of the present invention.

First, the semiconductor device shown in FIG. 7 includes a MOSFET 702 formed on a silicon substrate 701, an interlayer insulating film 703 composed of a silicon oxide film, a barrier metal layer 704 composed of a TiN film, and a tungsten plug composed of a tungsten via 705. Further, the semiconductor device includes a barrier insulating film 706 composed of a SiCN film, an interlayer insulating film 707 composed of a SiOCH film having a relative permittivity of 3 or less, and a copper wiring composed of a barrier metal layer 708 composed of a laminated film consisting of a Ta film and a TaN film and a copper layer 709.

A barrier insulating film 710 composed of a SiN film has an opening on the copper layer 709 of the copper wiring. A resistive-change layer including a first ion conductive layer 711 and a second ion conductive layer 712, a first upper electrode 713, and a second upper electrode 714 are stacked on the opening. The copper layer 709 is used as one of the electrodes in the resistive-change layer.

The resistive-change layer is made of the solid electrolyte and the first ion conductive layer 711 has a laminated structure that is composed of titanium oxide, and aluminum oxide or titanium oxide and aluminum oxide. The second ion conductive layer 712 includes a polymeric film having a relative permittivity of 2.1 or more and 3.0 or less that contains silicon, oxygen, and carbon. The first upper electrode 713 is composed of Ru, RuTa, or a RuTi alloy film. The second upper electrode 714 is composed of a Ta film, a Ti film, or a nitride film composed of these films. A barrier insulating film 715 is composed of a SiN film.

A copper wiring 719 composed of a barrier metal layer 717 that is a laminated film composed of the Ta film and the TaN film formed in an interlayer insulating film 716 composed of the SiOCH film and a copper layer 718 is connected to the second upper electrode 714. A wiring layer that is an upper layer or the like is formed on the copper wiring 719 via a barrier insulating film 720 composed of a SiCN film or the like.

By using the above-mentioned structure, the switching element including the resistive-change layer can be mounted inside the semiconductor device such as the most-advanced ULSI (Ultra-Large Scale Integration) logic or the like. Such laminated structure is effective for not only the switching element for FPGA but also a memory element structure for realizing a large scale memory amount.

Figure 8:
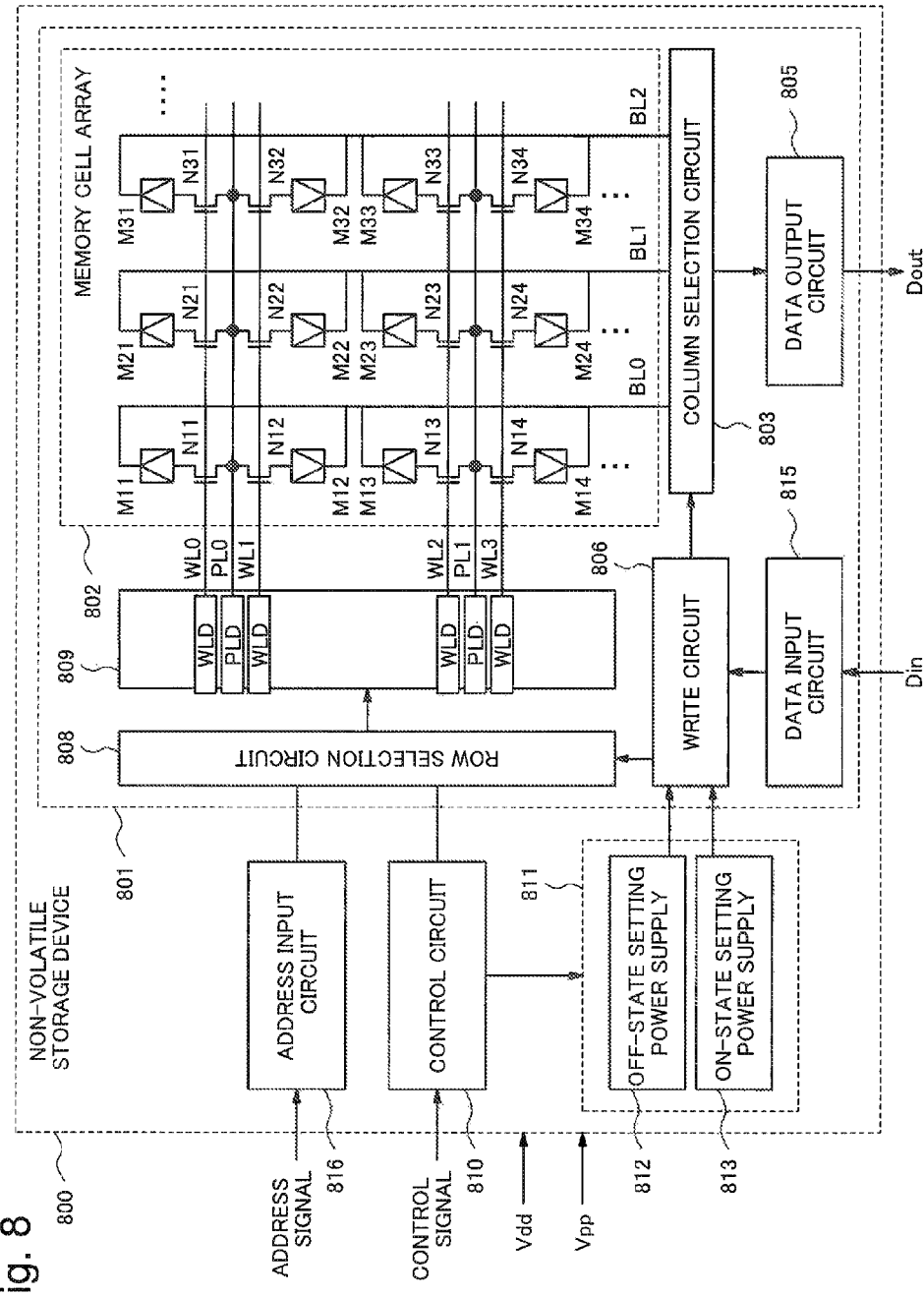
FIG. 8 is a figure showing a configuration of a nonvolatile storage device including a switching element according to a fourth exemplary embodiment of the present invention.

FIG. 8 is a block diagram showing a configuration of a non-volatile storage device 800 mounting the switching element shown in FIG. 7.

As shown in FIG. 8, the non-volatile storage device 800 includes a memory main body unit 801 on a CMOS (Complementary Metal-Oxide Semiconductor) semiconductor substrate. The memory main body unit 801 includes a memory cell array 802, a row selection circuit 808, a row driver 809 including a word line driver WLD and a plate line driver PLD, a column selection circuit 803, and a write circuit 806 for writing data. Further, the memory main body unit 801 includes a data input circuit 815 which performs an input process of input data via a terminal Din and a data output circuit 805 which performs an output process of output data via a terminal Dout.

Further, the memory main body unit 801 includes a power supply for changing the state to the low-resistance (LR) state (an OFF-state setting power supply 812) and a power supply for changing the state to the high-resistance (HR) state (an ON-state setting power supply 813) as a power supply 811 for writing. The output of the OFF-state setting power supply 812 and the output of the ON-state setting power supply 813 are supplied to the write circuit 806.

Further, the memory main body unit 801 includes an address input circuit 816 which receives an address signal inputted from the outside and a control circuit 810 which controls the operation of the memory main body unit 801 and the operation of the power supply 811 for writing on the basis of the control signal inputted from the outside.

The memory cell array 802 is formed on the semiconductor substrate and includes a plurality of word lines WL0, WL1, WL2, . . . and a plurality of bit lines BL0, BL1, BL2, . . . that are arranged so as to intersect with each other. Further, the memory cell array 802 includes a plurality of NMOS transistors N11, N12, N13, N21, N22, N23, N31, N32, N33, . . . (hereinafter, referred to as "transistors N11, N12, . . . ") provided at the intersections of the two lines. Further, the memory cell array 802 includes a plurality of resistive-change elements M11, M12, M13, M21, M22, M23, M31, M32, M33, . . . (hereinafter, referred to as "resistive-change elements M11, M12, . . . ") that are connected to the transistors N11, N12, . . . in series in one-on-one manner.

As shown in FIG. 8, the gates of the transistors N11, N21, N31, . . . are connected to the word line WL0. The gates of the transistors N12, N22, N32, . . . are connected to the word line WL1. The gates of the transistors N13, N23, N33, . . . are connected to the word line WL2. The gates of the transistors N14, N24, N34, . . . are connected to the word line WL3.

The resistive-change elements M11, M12, M13, M14, . . . are connected to the bit line BL0. The resistive-change elements M21, M22, M23, M24, . . . are connected to the bit line BL1. The resistive-change elements M31, M32, M33, M34, . . . are connected to the bit line BL2.

The address input circuit 816 receives the address signal from an external circuit (not shown), outputs a row address signal to the row selection circuit 808 on the basis of this address signal, and outputs a column address signal to the column selection circuit 803 (not shown). Here, the address signal is a signal showing the address of a specified memory cell that is selected from among a plurality of memory cells M11, M12, . . . .

The control circuit 810 controls the power supply 811 for writing and the write circuit 806 so that in a cycle of writing data, the data is written in the resistive-change element included in the memory cell selected by a selection unit mentioned later. In this process, a voltage setting signal indicating a voltage level of the pulse voltage used when writing is performed is outputted to the power supply 811 for writing and a write signal by which the write circuit 806 is instructed to apply a voltage for writing according to input data Din inputted to the data input circuit 815 is outputted to the write circuit 806. On the other hand, in a cycle of reading data, the control circuit 810 outputs a read signal by which the read operation is performed.

The row selection circuit 808 receives the row address signal outputted by the address input circuit 816. The row driver 809 applies a predetermined voltage to the selected word line by the word line driver circuit WLD corresponding to one of a plurality of the word lines WL0, WL1, WL2, . . . according to the row address signal.

Further, the column selection circuit 803 receives the column address signal outputted by the address input circuit 816. One of a plurality of the bit lines BL0, BL1, BL2, . . . is selected according to this column address signal. The voltage for writing or the voltage for reading is applied to the selected bit line and a non-selection voltage is applied to the non-selected bit line.

Further, a selection unit which selects at least one memory cell from the memory cell array 802 is composed of the row selection circuit 808 and the column selection circuit 803.

The write circuit 806 is a circuit which performs control so that the voltage pulse based on the power supply supplied by the power supply 811 for writing is applied to the resistive-change element included in the memory cell selected by the selection unit under the control of the control circuit 810. Here, when the write circuit 806 receives the write signal outputted by the control circuit 810, upon receiving the signal of an instruction to apply the voltage for writing to the bit line selected by the column selection circuit 803, the write circuit 806 outputs the write pulse according to the voltage set by a write mode.

When a ratio of an OFF state resistance to an ON state resistance of the resistive-change element is low, a sense amplifier (not shown) can be used. By using this configuration, in a cycle of reading data, an amount of current flowing in the selected bit line that is a read object is detected according to one detection level that meets the purpose in a plurality of the detection levels. When the amount of current flowing in the bit line is greater than the detection level, the data of "0 (low-resistance state)" is outputted and when the amount of current flowing in the bit line is smaller than the detection level, the data of "1 (high-resistance state)" is outputted as a logical result and the state of the stored data is determined. Output data Dout obtained as the result is outputted outside the circuit via the data output circuit 805.

The power supply 811 for writing includes the OFF-state setting power supply 812 which supplies the power supply for generating the pulse voltage used when changing (merely referred to as writing) the state of the switching element to the low-resistance (LM) state. Further, the power supply 811 for writing includes the ON-state setting power supply 813 which supplies the power supply for generating the pulse voltage used when changing (merely referred to as erasing) the state of the switching element to the high-resistance (HM) state. Both the OFF-state setting power supply 812 and the ON-state setting power supply 813 are connected to the write circuit 806.

The first electrode of the resistive-change element is connected to a BL side and the second electrode is connected to a PL side. For example, when the resistance state is changed from the high-resistance state to the low-resistance state (a setting operation is performed), a PL is grounded and the voltage is applied to a BL and whereby, the resistive-change element is programmed. The programming current can be controlled by a saturation current of a transistor. On the other hand, when the resistance state is changed from the low-resistance state to the high-resistance state (a reset operation is performed), the BL is grounded and an erase voltage is applied to the PL. In such circuit configuration, a function to perform verification and reprogramming based on the verification is provided to the write circuit on the basis of the second and third exemplary embodiments and whereby, false writing can be prevented.

By using the method for programming the switching element according to this exemplary embodiment, the method for performing suitable verification and reprogramming based on the verification used when programming the switching element using the metal-bridge-type resistance change is provided. As a result, the state of the switching element can be highly reliably changed from the ON state to the OFF state or vice versa. Further, the state of each switching element can be highly reliably changed and whereby, many switching elements can be used. Namely, the switching element can be highly integrated.

As described above, by using this exemplary embodiment, the method for performing verification and reprogramming based on the verification used when programming the switching element using the metal-bridge-type resistance change is provided and a switching element that is highly reliable and can be highly integrated can be realized.

In the above-mentioned exemplary embodiment of the present invention, with respect to a semiconductor device including a CMOS circuit, a case in which the resistive-change element is formed inside a copper multi-layer wiring on a semiconductor substrate has been explained as an example. The present invention is not limited to this case. The present invention can be applied to a semiconductor device including a memory circuit such as a bipolar transistor or the like, a semiconductor device including a logic circuit such as a microprocessor or the like, or a copper wiring of a board or a package on which these devices are mounted together.

Further, the present invention can be applied to a case in which an electronic circuit device, an optical circuit device, a quantum circuit device, a micromachine, MEMS (Micro Electro Mechanical Systems), or the like is joined to the semiconductor device. In the explanation of the present invention, a switch function is mainly taken as an example. However, the present invention can also be applied to a memory element which uses both the non-volatile characteristic and the resistive-change characteristic.

The invention of the present application is not limited to the above mentioned exemplary embodiment. The present invention of course includes various variations and modifications that could be made by those skilled in the art according to the overall disclosure including the claims and the technical concept.

This application claims priority from Japanese Patent Application No. 2013-131263, filed on Jun. 24, 2013, the disclosure of which is hereby incorporated by reference in its entirety.

INDUSTRIAL APPLICABILITY

The present invention can be applied to a switching element such as a FPGA or the like and a memory element that are semiconductor devices.

REFERENCE SIGNS LIST

101 first electrode
102 second electrode
103 resistive-change film
201 first terminal
202 second terminal
701 silicon substrate
702 MOSFET
703 interlayer insulating film
704 barrier metal layer
705 tungsten via
706 barrier insulating film
707 interlayer insulating film
708 barrier metal layer
709 copper layer
710 barrier insulating film
711 first ion conductive layer
712 second ion conductive layer
713 first upper electrode
714 second upper electrode
715 barrier insulating film
716 interlayer insulating film
717 barrier metal layer
718 copper layer
719 copper wiring
720 barrier insulating film
800 non-volatile storage device
801 memory main body unit
802 memory cell array
803 column selection circuit
805 data output circuit
806 write circuit
808 row selection circuit
809 row driver
810 control circuit
811 power supply for writing
812 OFF-state setting power supply
813 ON-state setting power supply
815 data input circuit
816 address input circuit

The invention claimed is:

1. A method for programming a switching element including a first electrode, a second electrode, and a resistive-change film which is provided between the first electrode and the second electrode and whose resistance value R increases or decreases according to an electric potential difference between the first electrode and the second electrode, in which programming of the switching element is performed by increasing or decreasing the resistance value R of the resistive-change film by applying a first pulse voltage to the first electrode or the second electrode, a measurement of the resistance value R is performed and verification in which it is determined whether or not the measured resistance value R is equal to a desired value is performed, and reprogramming of the switching element is performed by applying a second pulse voltage whose polarity is the same as that of the first pulse voltage to the same electrode to which the first pulse voltage is applied on the basis of the resistance value R when the resistance value R is not equal to the desired value, in which in the reprogramming, a pulse width of the second pulse voltage and an electric current flowing when the second pulse voltage is applied are determined according to an equation of the resistance value: $R=A*I^m*t^n$ (I represents an electric current and t represents a pulse width) wherein the values of A, m, and n are given in advance.

2. The method for programming a switching element described in claim 1 in which the resistive-change film is a metal-bridge-type resistive-change film.

3. The method for programming a switching element described in claim 1 in which the resistance value R corresponds to an amount of a conductive substance in the resistive-change film and the second pulse voltage determined according to the equation of the resistance value: $R=A*I^m*t^n$ provides a shortfall of the conductive substance in the resistive-change film or collects a residue of the conductive substance.

4. The method for programming a switching element described in claim 1 in which the second pulse voltage is the same as the first pulse voltage.

5. The method for programming a switching element described in claim 1 in which after the reprogramming is performed, the verification is performed again.

6. The method for programming a switching element described in claim 1 in which in the verification, the resistance value R is measured by using a voltage whose polarity is the same as that of the first pulse voltage.

7. The method for programming a switching element described in claim 1 in which the resistive-change film contains a solid electrolyte.

8. The method for programming a switching element described in claim 1 in which the first electrode contains copper.

9. The method for programming a switching element described in claim 1 in which the second electrode contains ruthenium.

* * * * *

UNITED STATES PATENT AND TRADEMARK OFFICE
CERTIFICATE OF CORRECTION

PATENT NO. : 9,530,496 B2  
APPLICATION NO. : 14/895239  
DATED : December 27, 2016  
INVENTOR(S) : Munehiro Tada It is certified that error appears in the above-identified patent and that said Letters Patent is hereby corrected as shown below:

In the Specification

Column 1, Line 10:
"4" has been replaced with --24--.

Signed and Sealed this
Thirtieth Day of January, 2018

Joseph Matal
*Performing the Functions and Duties of the*
*Under Secretary of Commerce for Intellectual Property and*
*Director of the United States Patent and Trademark Office*